United States Patent
Yasunaka

(10) Patent No.: US 10,374,598 B2
(45) Date of Patent: Aug. 6, 2019

(54) POWER ON RESET CIRCUIT AND HIGH FREQUENCY COMMUNICATION DEVICE

(71) Applicant: SONY SEMICONDUCTOR SOLUTIONS CORPORATION, Kanagawa (JP)

(72) Inventor: Kentaro Yasunaka, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/519,485

(22) PCT Filed: Aug. 6, 2015

(86) PCT No.: PCT/JP2015/072338
§ 371 (c)(1),
(2) Date: Apr. 14, 2017

(87) PCT Pub. No.: WO2016/063597
PCT Pub. Date: Apr. 28, 2016

(65) Prior Publication Data
US 2017/0244406 A1 Aug. 24, 2017

(30) Foreign Application Priority Data
Oct. 24, 2014 (JP) ................. 2014-216884

(51) Int. Cl.
*H03K 17/22* (2006.01)
*H03K 5/24* (2006.01)

(52) U.S. Cl.
CPC ............. *H03K 17/223* (2013.01); *H03K 5/24* (2013.01); *H03K 17/22* (2013.01)

(58) Field of Classification Search
CPC ......... H03K 17/223; H03K 5/24; H03K 17/22
See application file for complete search history.

(56) References Cited

U.S. PATENT DOCUMENTS

| | | | | |
|---|---|---|---|---|
| 2004/0201411 A1* | 10/2004 | White | .................... | G06F 7/607 327/407 |
| 2012/0032717 A1* | 2/2012 | Suzuki | .................... | G06F 1/24 327/143 |
| 2014/0273856 A1* | 9/2014 | Kyles | .................... | H04B 1/401 455/41.2 |

FOREIGN PATENT DOCUMENTS

| | | |
|---|---|---|
| JP | 08-186484 A | 7/1996 |
| JP | 8-186484 A | 7/1996 |

(Continued)

OTHER PUBLICATIONS

International Search Report and Written Opinion of PCT Application No. PCT/JP2015/072338, dated Sep. 15, 2015, 7 pages of English Translation and 7 pages of ISRWO.

(Continued)

*Primary Examiner* — Daniel C Puentes
(74) *Attorney, Agent, or Firm* — Chip Law Group

(57) ABSTRACT

A power on reset circuit according to the present disclosure includes: a reference voltage generating circuit that generates a reference voltage, and also outputs, as a control voltage, a voltage at a node at which a voltage rise is slower than the reference voltage; a comparison voltage generating circuit that operates in response to the control voltage output from the reference voltage generating circuit, and outputs a comparison voltage depending on a power source voltage; and a comparison circuit that compares the comparison voltage output from the comparison voltage generating circuit to the reference voltage output from the reference voltage generating circuit, and outputs an operation signal while the comparison voltage exceeds the reference voltage.

9 Claims, 10 Drawing Sheets

(56) References Cited

FOREIGN PATENT DOCUMENTS

| | | | |
|---|---|---|---|
| JP | 2005-278056 | A | 10/2005 |
| JP | 2010-213046 | A | 9/2010 |
| JP | 2011-082785 | A | 4/2011 |
| JP | 2011-82785 | A | 4/2011 |
| JP | 2013-036744 | A | 2/2013 |
| JP | 2013-36744 | A | 2/2013 |
| WO | 2014/162833 | A1 | 10/2014 |

OTHER PUBLICATIONS

International Preliminary Report on Patentability of PCT Application No. PCT/JP2015/072338, dated May 4, 2017, 8 pages of English Translation and 4 pages of IPRP.

\* cited by examiner

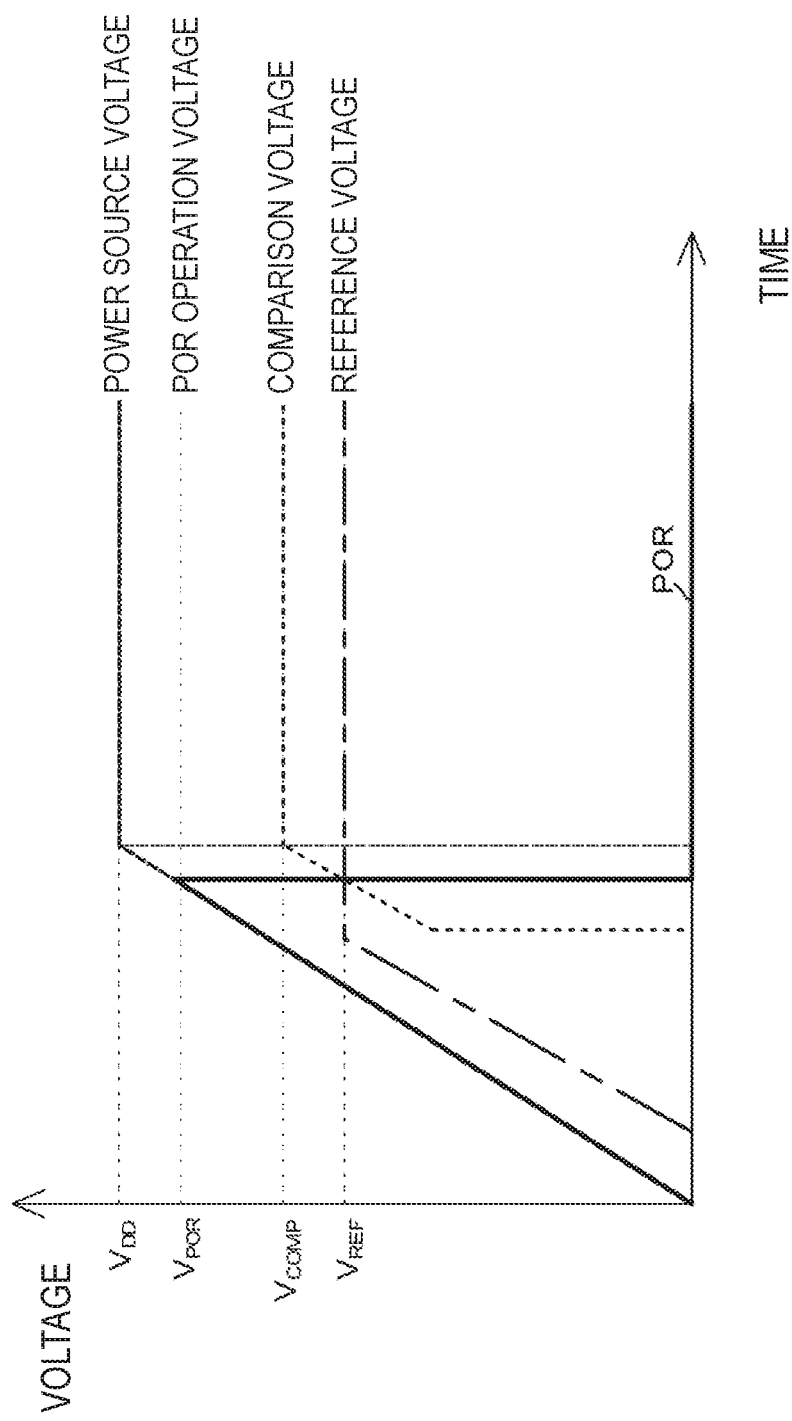

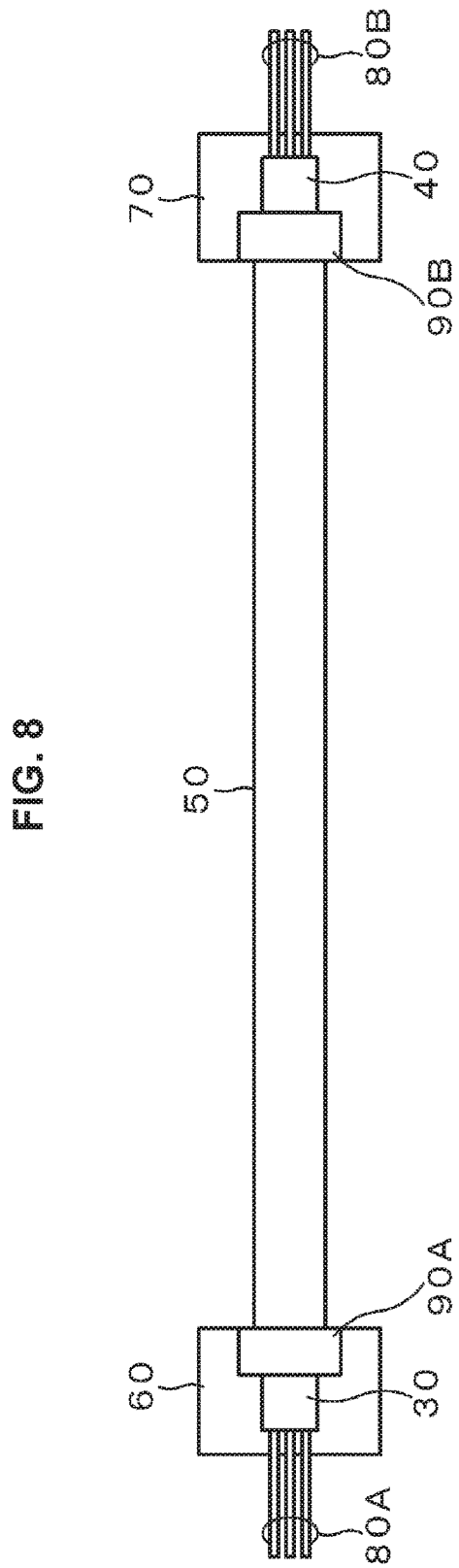

POWER ON RESET CIRCUIT AND HIGH FREQUENCY COMMUNICATION DEVICE

CROSS REFERENCE TO RELATED APPLICATIONS

This application is a U.S. National Phase of International Patent Application No. PCT/JP2015/072338 filed on Aug. 6, 2015, which claims priority benefit of Japanese Patent Application No. JP 2014-216884 filed in the Japan Patent Office on Oct. 24, 2014. Each of the above-referenced applications is hereby incorporated herein by reference in its entirety.

TECHNICAL FIELD

The present disclosure relates to a power on reset circuit and a high frequency communication device.

BACKGROUND ART

Various electronic apparatuses are provided with a power on reset circuit which monitors the rise of a power source voltage and resets a desired circuit when the power source voltage reaches a desired voltage or more. A power on reset circuit generally adopts a system in which a comparator compares a comparison voltage obtained by resistively dividing a power source voltage to a reference voltage. The power on reset circuit adopting this system raises concern that a malfunction may occur when the power source voltage is low.

In order to prevent such a malfunction during the operation at a low power source voltage, it has been devised that a time difference is established between the reference voltage which serves as a reference input of a comparator and the comparison voltage which serves as a comparison input (for example, see Patent Literatures 1 and 2).

CITATION LIST

Patent Literature

Patent Literature 1: JP 2005-278056A
Patent Literature 2: JP 2010-213046A

DISCLOSURE OF INVENTION

Technical Problem

However, even in the above-described prior art, its operation has not been sufficiently ensured. Furthermore, the prior art has a configuration in which a redundant circuit for ensuring the operation is added. Specifically, in the prior art disclosed in Patent Literature 1, there is a risk that variations of processes may cause malfunctions during the operation at a low voltage. Also, in the prior art disclosed in Patent Literature 2, a redundant circuit (start-up circuit) is used for establishing a time difference between the reference voltage and the comparison voltage, in addition to the reference voltage source and the comparator.

Therefore, the present disclosure has its object to provide a power on reset circuit which can stably operate even during the operation under a low power source voltage without adding a redundant circuit, and a high frequency communication device including the power on reset circuit.

Solution to Problem

In order to achieve the above object, a power on reset circuit according to the present disclosure includes: a reference voltage generating circuit that generates a reference voltage, and also outputs, as a control voltage, a voltage at a node at which a voltage rise is slower than the reference voltage; a comparison voltage generating circuit that operates in response to the control voltage output from the reference voltage generating circuit, and outputs a comparison voltage depending on a power source voltage; and a comparison circuit that compares the comparison voltage output from the comparison voltage generating circuit to the reference voltage output from the reference voltage generating circuit, and outputs an operation signal while the comparison voltage exceeds the reference voltage.

In the power on reset circuit or the high frequency communication device configured as described above, the use of the voltage at a specific node in the reference voltage generating circuit as a control voltage for causing the comparison voltage generating circuit to operate enables a time difference to be provided between the reference voltage and the comparison voltage without adding a redundant circuit. The comparison voltage increases after the reference voltage is stabilized during the rise of the power source voltage, and the comparison voltage declines before the reference voltage becomes unstable during the fall of the power source voltage. Therefore, a stable operation is enabled even when the circuit operates under a low power source voltage.

Advantageous Effects of Invention

According to the present disclosure, a stable operation is enabled even under a low power source voltage without adding a redundant circuit. Therefore, the operation can be sufficiently ensured.

Note that the present disclosure is not limited to exhibiting the effect described herein at all and may exhibit any effect described in the present specification. In addition, the effects described in the present specification are not limiting but are merely examples, and there may be additional effects.

BRIEF DESCRIPTION OF DRAWINGS

FIG. 2A indicates a relationship between a diode forward voltage $V_d$ and a current I; FIG. 2B indicates changes, with respect to temperature, of the diode forward voltage $V_d$ and a voltage difference $\Delta V_d$ when different currents $I_1$ and $I_2$ flow; and FIG. 2C indicates a circuit configuration for generating the different currents $I_1$ and $I_2$.

FIG. 3A indicates a circuit configuration of a band gap reference circuit which does not include a start-up circuit; and FIG. 3B indicates a change of a difference $V_a$-$V_b$ between a voltage $V_a$ and a voltage $V_b$ when a power source voltage $V_{DD}$ increases.

FIG. 5A indicates voltage changes during the rise of a power source voltage; and FIG. 5B indicates voltage changes during the fall of a power source voltage.

FIG. 6 is a diagram illustrating an example of the selection of a bias voltage in a power on reset circuit according to an embodiment of the present disclosure.

FIG. 7A indicates an example of a system configuration of a high frequency communication device; and FIG. 7B indicates an example of a specific configuration of a sending unit and a receiving unit.

FIG. 8 is a schematic plan diagram partly containing a cross section, which indicates an example of a configuration of a dielectric waveguide and connectors which are used in a high frequency communication device according to the present disclosure.

MODE(S) FOR CARRYING OUT THE INVENTION

Figure 1:
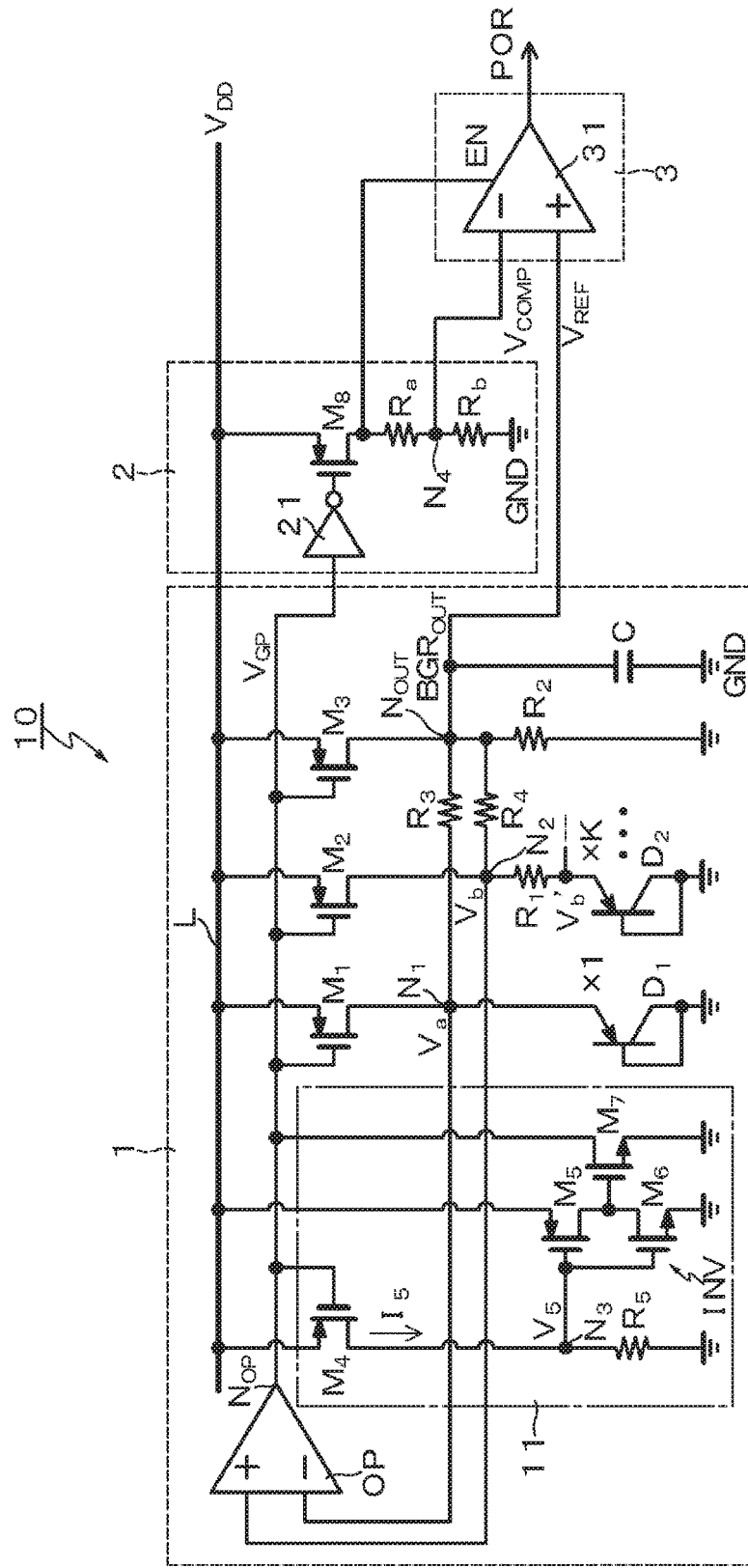
FIG. 1 is a circuit diagram indicating a configuration example of a power on reset circuit according to an embodiment of the present disclosure.

Hereinafter, preferred embodiments for implementing the technology of the present disclosure (which will be described hereinafter as "embodiments") will be described in detail with reference to the appended drawings. The technology of the present disclosure is not limited to the embodiments, and the various numeric values and materials shown in the embodiments are examples. In description provided below, structural elements that have substantially the same function and structure are denoted with the same reference numerals, and repeated explanation of these structural elements is omitted. Note that description will be provided in the following order.

1. Description on the whole of power on reset circuit and high frequency communication device of the disclosure
2. Power on reset circuit according to an embodiment of the disclosure
2-1. Reference voltage generating circuit
2-1-1. Operation principle of band gap reference circuit
2-1-2. Start-up circuit
2-2. Comparison voltage generating circuit and comparison circuit
2-3. Circuit operation of power on reset circuit
2-3-1. During rise of power source voltage
2-3-2. During fall of power source voltage
2-4. Action and effect of the embodiments
2-5. Selection of bias voltage
3. High frequency communication device <Description on the Whole of Power on Reset Circuit and High Frequency Communication Device of the Disclosure>

In a power on reset circuit and a high frequency communication device according to the present disclosure, a reference voltage generating circuit may be constituted by a band gap reference circuit. The band gap reference circuit may include: a first diode element that includes one diode element; a second diode element that includes a plurality of diode elements which are connected in parallel; current sources that supply the first diode element and the second diode element with currents having identical current values; and an operational amplifier that controls the current sources such that the first diode element and the second diode element have identical inter-terminal voltages. A node at which the voltage rise is slower than a reference voltage may serve as the output node of the operational amplifier.

In the power on reset circuit and the high frequency communication device according to the present disclosure which contain the above-described preferable configuration, a comparison voltage generating circuit may be constituted by a resistive divider circuit which has: two resistive elements which are connected in series between a power source line of a power source voltage and a ground; and a switch element that selectively connects the power source line and the two resistive elements based on a control voltage which is output from the reference voltage generating circuit.

Also, the high frequency communication device according to the present disclosure may include: a sending unit that converts a transmission target signal into a high frequency signal, and sends the converted signal; a waveguide cable that transmits the high frequency signal sent from the sending unit; and a receiving unit that restores the high frequency signal received through the waveguide cable into the original transmission target signal. The sending unit is mounted inside a connector device that connects the sending unit and the waveguide cable, and the receiving unit is mounted inside a connector device that connects the waveguide cable and the receiving unit. At least one of the sending unit and the receiving unit may have the power on reset circuit. Furthermore, the high frequency signal may be a millimeter wave band signal.

<Power on Reset Circuit According to an Embodiment of the Disclosure>

FIG. 1 is a circuit diagram indicating a configuration example of a power on reset circuit according to an embodiment of the present disclosure. As indicated in FIG. 1, a power on reset circuit 10 includes a reference voltage generating circuit 1, a comparison voltage generating circuit 2, and a comparison circuit 3. The power on reset circuit 10 monitors the rise of a power source voltage $V_{DD}$, and resets a desired circuit when the power source voltage $V_{DD}$ reaches a desired voltage or more. That is, it can also be said that the power on reset circuit 10 is a power source monitoring circuit. The power source voltage $V_{DD}$ is a low voltage of approximately 1.0 [V] to 1.2 [V], for example, 1.1 [V].

[Reference Voltage Generating Circuit]

The reference voltage generating circuit 1 is constituted by, for example, a band gap reference circuit, and generates a reference voltage $V_{REF}$ to be used in the comparison circuit 3. The reference voltage generating circuit 1 has p-channel type field effect transistors $M_1$ to $M_3$, a first diode element $D_1$, a second diode element $D_2$, resistive elements $R_1$ to $R_4$, a capacity element C, an operational amplifier OP, and a start-up circuit 11. The first diode element $D_1$ includes one diode element. The second diode element $D_2$ includes a plurality of diode elements (K diode elements) which are connected in parallel.

The field effect transistor $M_1$ and the first diode element Di are connected in series between a power source line L of the power source voltage $V_{DD}$ and a ground (GND). The first diode element Di is constituted by a pnp bipolar transistor having a diode connection configuration in which a base and a collector are commonly connected. The field effect transistor $M_2$, the resistive element $R_1$, and the second diode element $D_2$ are connected in series between the power source line L and the ground. The second diode element $D_2$ is constituted by K pnp bipolar transistors having a diode connection configuration which are connected in parallel. The field effect transistor Mi and the field effect transistor $M_2$ serve as current sources which supply identical currents to the first diode element Di and the second diode element $D_2$ respectively.

The field effect transistor $M_1$ and the field effect transistor $M_2$ serve as current sources which supply currents having identical current values to the first diode element $D_1$ and the second diode element $D_2$ respectively. Here, the "identical current values" mean not only strictly identical current values but also substantially identical current values. The existence of all variations caused by design or manufacture is allowable.

The field effect transistor $M_3$ and the resistive element $R_2$ are connected in series between the power source line L and the ground. The common connection node between the field effect transistor $M_3$ and the resistive element $R_2$ becomes an output node $N_{OUT}$ of the reference voltage generating circuit 1. From this output node $N_{OUT}$, an output voltage $BGR_{OUT}$ of the reference voltage generating circuit 1 is derived. This output voltage $BGR_{OUT}$ is supplied to the comparison circuit 3 as the reference voltage $V_{REF}$.

The resistive element $R_3$ is connected between a common connection node $N_1$ between the field effect transistor $M_1$ and the first diode element $D_1$ and the output node $N_{OUT}$. The resistive element $R_4$ is connected between a common connection node $N_2$ between the field effect transistor $M_2$ and the resistive element $R_1$ and the output node $N_{OUT}$. The capacity element C is connected between the output node $N_{OUT}$ and the ground.

A voltage $V_a$ at the common connection node $N_1$ between the field effect transistor $M_1$ and the diode element $D_1$ is an inter-terminal voltage of the first diode element $D_1$, and becomes an inverting (−) input of the operational amplifier OP. A voltage $V_b$ at the common connection node $N_2$ between the field effect transistor $M_2$ and the resistive element $R_1$ is an inter-terminal voltage of the second diode element $D_2$, and becomes a non-inverting (+) input of the operational amplifier OP. During the rise of the power source voltage $V_{DD}$, the rise of the voltage at an output node $N_{OP}$ of the operational amplifier OP is slower than that of the output voltage $BGR_{OUT}$ of the reference voltage generating circuit 1, that is, the reference voltage $V_{REF}$. A reason for that will be described later.

The voltage at the output node $N_{OP}$ of the operational amplifier OP, that is, an output voltage $V_{GP}$ of the operational amplifier OP, is applied to the gate electrodes of the field effect transistors $M_1$ to $M_3$. Accordingly, the operational amplifier OP controls the gate voltage (=output voltage $V_{GP}$) of the field effect transistors $M_1$ and $M_2$ which are current sources, such that the voltage $V_a$ at the node $N_1$, the voltage $V_b$ at the node $N_2$, and the output voltage $BGR_{OUT}$ increase, and $V_a$=$V_b$ is achieved. Also, the output voltage $V_{GP}$ of the operational amplifier OP is supplied to the comparison voltage generating circuit 2 as a control voltage for controlling the operation of the comparison voltage generating circuit 2.

(Operation Principle Of Band Gap Reference Circuit)

Here, the operation principle of the band gap reference circuit constituting the reference voltage generating circuit 1 will be described with reference to FIGS. 2A, 2B and 2C. The band gap reference circuit takes advantage of the temperature characteristics of a diode. The operation principle thereof is as follows.

Figure 2A:
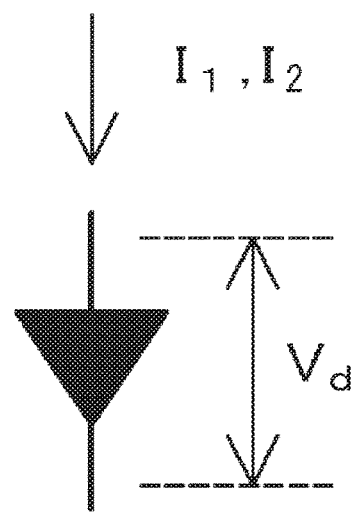
FIGS. 2A, 2B and 2C are illustrative diagrams on an operation principle of a band gap reference circuit which constitutes a reference voltage generating circuit.

As indicated in FIG. 2A, when a forward voltage $V_d$ is applied to the both ends of a diode, a current I flows through the diode. The relationship between the forward voltage $V_d$ and the current I comes to be the following formula (1).

$$V_d = \frac{k_B T}{e} \ln \frac{I}{I_s} \quad (1)$$

Figure 2B:
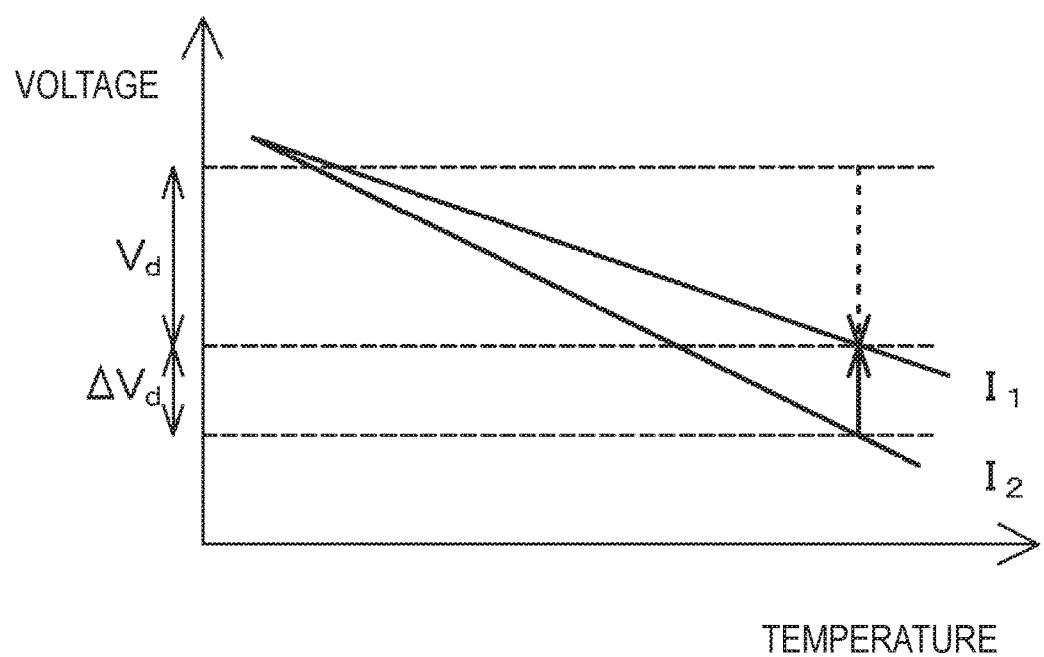

When a current $I_1$ flows from a current source to a diode, the voltage $V_d$ applied to the both ends of the diode decreases in proportional to temperature (the temperature coefficient is negative (Complementary To Absolute Temperature (CTAT)), as indicated by a downward arrow (dotted lines) in FIG. 2B. When a current $I_1$ and a current $I_2$, which are different from each other, flow from a current source to a diode, a voltage difference $\Delta V_d$ between the both ends of the diode increases in proportional to temperature (the temperature coefficient is positive (Proportional To Absolute Temperature (PTAT)), as indicated by an upward arrow (solid line) in FIG. 2B. By taking advantage of such different changes with respect to temperature, there can be prepared a voltage source which is constant with respect to temperature changes, that is, the reference voltage generating circuit 1.

Figure 2C:
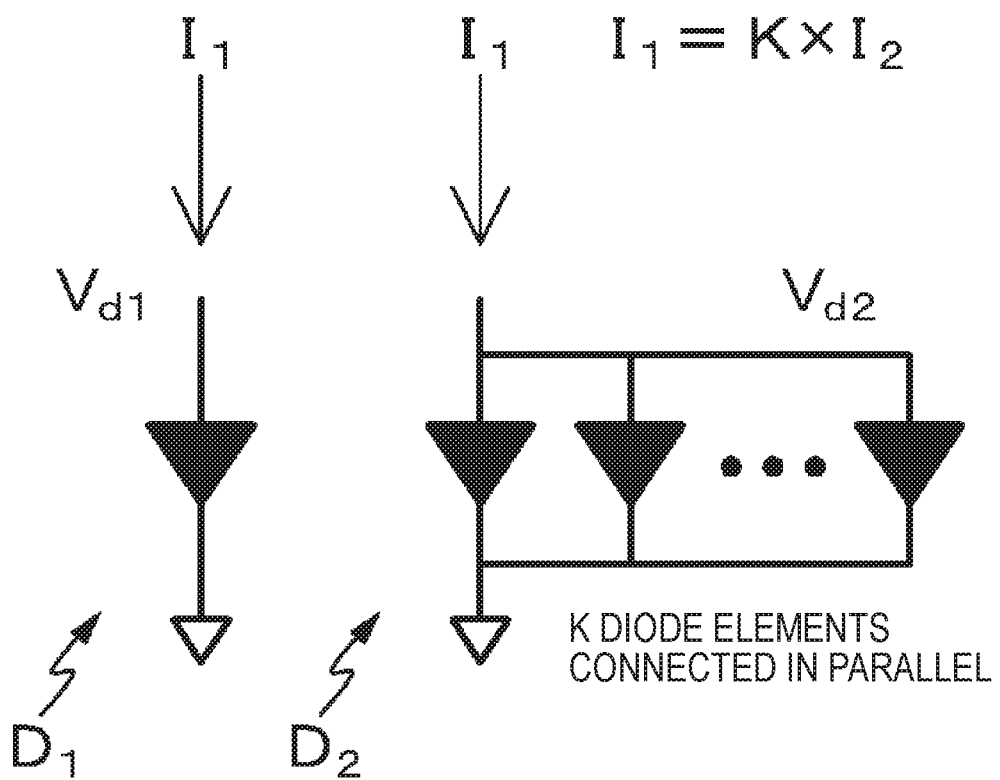

For generating the current $I_1$ and the current $I_2$ which are different from each other, there are prepared, as indicated in FIG. 2C, a circuit through which the current $I_1$ from the current source ($M_1$) flows to the one diode element $D_1$, and a circuit through which the current $I_1$ from the current source ($M_2$) flows to the diode element $D_2$ which includes K diodes connected in parallel. The voltage difference $\Delta V_d$ (=$V_{d1}$−$V_{d2}$) between a voltage $V_{d1}$ and a voltage $V_{d2}$ which are generated on the both ends of the diode element $D_1$ and the diode element $D_2$ respectively comes to be the following formula (2) (PTAT), from $I_1$=K×$I_2$, based on formula (1).

$$\Delta V_d = V_{d1} - V_{d2} \quad (2)$$
$$= \frac{k_B T}{e} \ln \frac{I_1}{I_s} - \frac{k_B T}{e} \ln \frac{I_1}{K \times I_s}$$
$$= \frac{k_B T}{e} \ln K$$

The temperature coefficients of PTAT and CTAT can be calculated as follows.

$$\frac{\partial V_d}{\partial T} = \frac{k_B}{e} \ln \frac{I}{I_s} \sim -1.5 [mV/K] \quad (3)$$

$$\frac{\partial \Delta V_d}{\partial T} = +0.0867 \times \ln K [mV/K] \quad (4)$$

A circuit independent of temperature can be prepared by setting appropriate constants $\alpha_1$ and $\alpha_2$ in the following formula (5) based on formula (3) and formula (4).

$$\frac{\partial BGR}{\partial T} = \alpha_1 \times \frac{\partial V_d}{\partial T} + \alpha_2 \times \frac{\partial \Delta V_d}{\partial T} = O \quad (5)$$

Then, in FIG. 1, the resistance values of the resistive elements $R_1$ to $R_4$ are selected. Accordingly, the band gap reference circuit constituting the reference voltage generating circuit 1 comes to be a circuit which is independent of temperature as in formula (5).

(Start-Up Circuit)

Meanwhile, a band gap has multiple stabilization points during the rise of the power source voltage $V_{DD}$. Therefore, the start-up circuit 11 is necessary to be included in the band gap reference circuit. This matter will be more specifically described below.

Figure 3A:
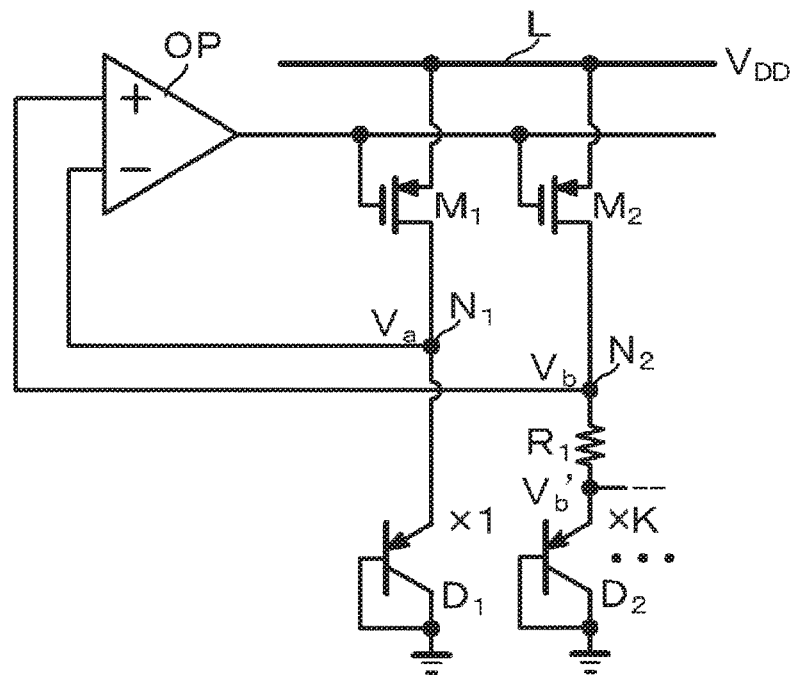
FIGS. 3A and 3B are diagrams illustrating the necessity of a start-up circuit.
Figure 3B:
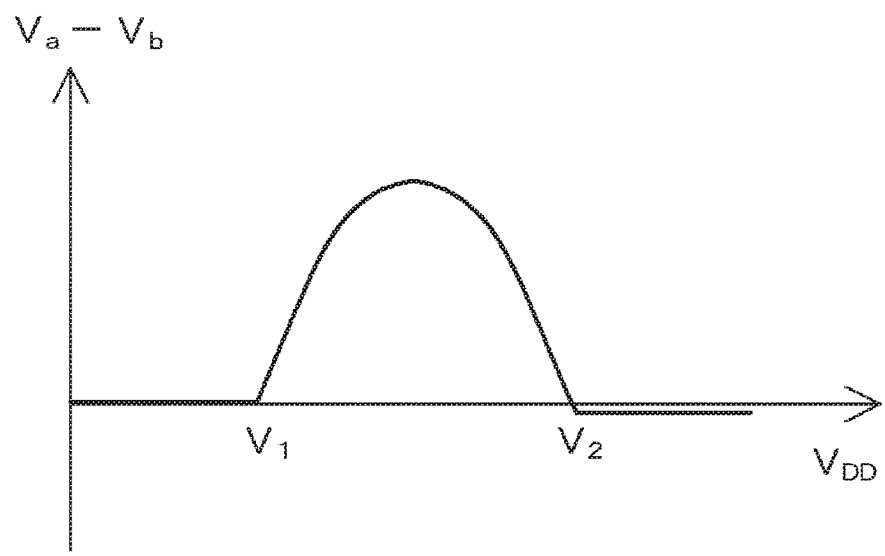

FIG. 3A is a circuit diagram indicating a band gap reference circuit which does not include a start-up circuit. In the band gap reference circuit indicated in FIG. 3A, the difference $V_a - V_b$ between the voltage $V_a$ at the node $N_1$ and the voltage $V_b$ at the node $N_2$ changes as indicated in FIG. 3B, when the power source voltage $V_{DD}$ increases. Specifically, while the power source voltage $V_{DD}$ is 0 to $V_1$, there is a region of $V_a - V_b \cong 0$.

Since there exists an input conversion offset of the operational amplifier OP, the band gap reference circuit indicated in FIG. 3A can stably operates even in the region of $V_a - V_b \cong 0$. In the band gap reference circuit, $V_1 \cong 0.4$ [V], and $V_2 \cong 0.7$ [V]. In order to prevent multiple solutions (interference solutions), a start-up circuit is usually provided. The start-up circuit 11 used in the reference voltage generating circuit 1 will be specifically described.

As indicated in FIG. 1, the start-up circuit 11 includes p-channel type field effect transistors $M_4$ and $M_5$, n-channel type field effect transistors $M_6$ and $M_7$, and a resistive element $R_5$. The field effect transistor $M_4$ and the resistive element $R_5$ are connected in series between the power source line L and the ground. The output voltage $V_{GP}$ of the operational amplifier OP is applied to the gate electrode of the field effect transistor $M_4$.

The field effect transistor $M_5$ and the field effect transistor $M_6$ are connected in series between the power source line L and the ground. The gate electrodes thereof are commonly connected thereby to constitute an inverter circuit INV. The input end (the common connection node of the gate electrodes) of this inverter circuit INV is connected with a common connection node $N_3$ between the field effect transistor $M_4$ and the resistive element $R_5$. The field effect transistor $M_7$ is connected between the power source line L and the ground. The gate electrode thereof is connected to the output end (the common connection node of the drain electrodes) of the inverter circuit INV.

When the power source voltage $V_{DD}$ is input in the start-up circuit 11 configured as described above, a current $I_5$ flows through the field effect transistor $M_4$, and a voltage $V_5$ is generated at the node $N_3$. When the power source voltage $V_{DD}$ is a desired voltage value or less, the voltage $V_5$ at the node $N_3$ is inverted by the inverter circuit INV, and the field effect transistor $M_7$ becomes in a conducting state. Furthermore, the output node $N_{OP}$ of the operational amplifier OP is fixed at the ground level.

When the power source voltage $V_{DD}$ becomes sufficiently high and exceeds a desired voltage value, the voltage $V_5$ at the node $N_3$ is inverted by the inverter circuit INV, and the field effect transistor $M_7$ becomes in a non-conducting state. Furthermore, a connection between the output node $N_{OP}$ of the operational amplifier OP and the ground is interrupted, and the band gap reference circuit starts up. The voltage $V_5$ at the node $N_3$ is selected such that the power source voltage $V_{DD}$ causes the start-up circuit 11 to operate with a voltage value which is more than a voltage $V_1$ in FIG. 3B.

After the start-up, currents flow from the field effect transistor $M_1$ and the field effect transistor $M_2$, which serve as current sources, to the first diode element $D_1$ and the second diode element $D_2$ respectively. Also, the voltage $V_a$ at the node $N_1$ and the voltage $V_b$ at node $N_2$ are both more than 0 [V] ($V_a$ and $V_b$>0). Although the operational amplifier OP operates such that $V_a = V_b$ is obtained, the solution (interference solution) of $V_a = V_b = 0$ is not rendered. Therefore, the band gap reference circuit stably operates.

Once the start-up circuit 11 operates, and the operational amplifier OP starts its operation, the operational amplifier OP adjusts its output voltage (the voltage at the output node $N_{OP}$) $V_{GP}$ such that $V_a = V_b$ is obtained. Specifically, when the voltages $V_a$ and $V_b$ become excessively high, drain-source voltages $V_{ds}$ of the field effect transistors $M_1$ and $M_2$ as current sources are nullified (reduced). Therefore, the operational amplifier OP adjusts its output voltage $V_{GP}$ as the power source voltage $V_{DD}$ increases. Then, when the power source voltage $V_{DD}$ becomes constant, the output voltage $V_{GP}$ of the operational amplifier OP also becomes constant.

Figure 4:
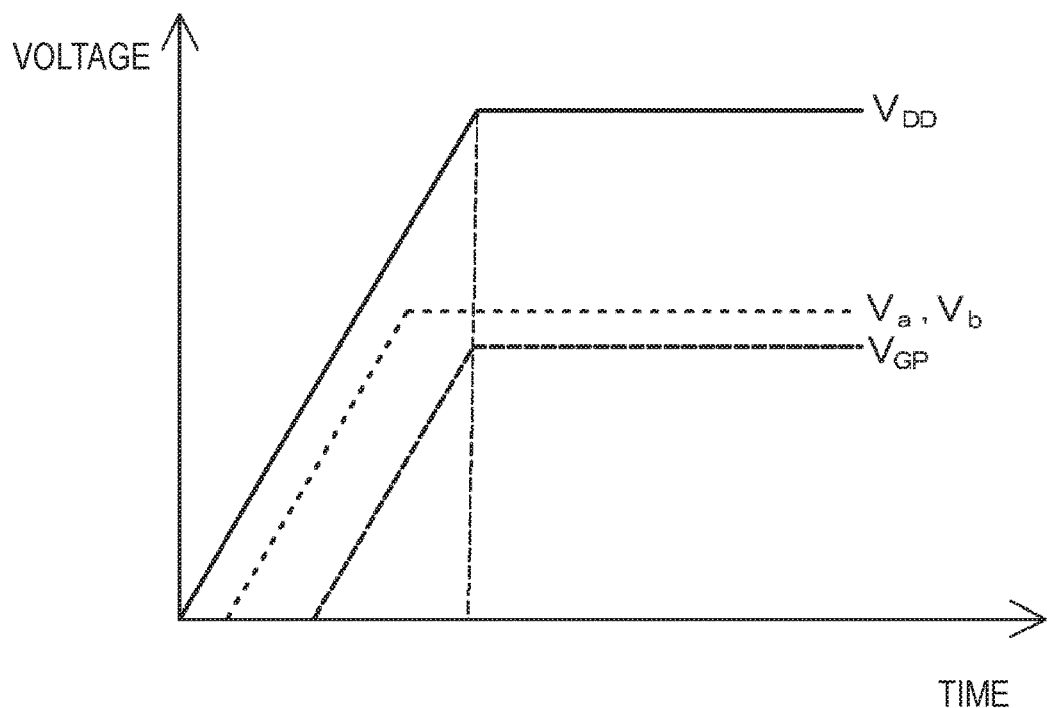
FIG. 4 is a diagram illustrating the rise of an output voltage $V_{GP}$ of an operational amplifier in a band gap reference circuit.

Meanwhile, since the voltages $V_a$ and $V_b$ reach a stability solution when a gain of the operational amplifier OP is produced, they achieve a constant value earlier than the output voltage $V_{GP}$ of the operational amplifier OP, as indicated in FIG. 4. Since the output voltage $BGR_{OUT}$ of the reference voltage generating circuit 1 is proportional to the voltages $V_a$ and $V_b$, it achieves a constant value concurrently with the voltages $V_a$ and $V_b$. For this reason, the output voltage $V_{GP}$ of the operational amplifier OP achieves a constant value later than the output voltage $BGR_{OUT}$ of the reference voltage generating circuit 1. In other words, the rise of the voltage $V_{GP}$ at the output node $N_{OP}$ of the operational amplifier OP is slower than that of the reference voltage $V_{REF}$ which is the output voltage $BGR_{OUT}$ of the reference voltage generating circuit 1.

[Comparison Voltage Generating Circuit and Comparison Circuit]

The comparison voltage generating circuit 2 is constituted by a resistive divider circuit which includes an inverter circuit 21, a p-channel type field effect transistor $M_8$, and resistive elements $R_a$ and $R_b$. The comparison voltage generating circuit 2 becomes in an operation state in response to the output voltage $V_{GP}$ of the operational amplifier OP, which is supplied as a control voltage from the reference voltage generating circuit 1.

In the comparison voltage generating circuit 2, the inverter circuit 21 inverts the polarity of the output voltage $V_{GP}$ of the operational amplifier OP supplied from the reference voltage generating circuit 1, and applies the inverted output voltage $V_{GP}$ to the gate electrode of the field effect transistor $M_8$. The field effect transistor $M_8$, the resistive element $R_a$, and the resistive element $R_b$ are connected in series between the power source line L of the power source voltage $V_{DD}$ and the ground.

When the field effect transistor $M_8$, which is an example of the switch element, becomes in a conducting state, it applies the power source voltage $V_{DD}$ to the resistive elements $R_a$ and $R_b$, and also supplies an enable signal EN to the comparison circuit 3. The resistive element $R_a$ and the resistive element $R_b$ are dividing resistance. When the field effect transistor $M_8$ is in a conducting state, the resistive elements $R_a$ and $R_b$ divide the power source voltage $V_{DD}$ according to their resistance ratios, and obtain a divided voltage depending on the power source voltage $V_{DD}$ from their common connection node $N_4$. This divided voltage is supplied as a comparison voltage $V_{COMP}$ to the comparison circuit 3.

The comparison circuit 3 is constituted by a comparator 31. The comparator 31 becomes in an operation state in response to the supply of the enable signal EN from the comparison voltage generating circuit 2. The comparator 31 treats as a non-inverting (+) input the reference voltage $V_{REF}$ which is the output voltage $BGR_{OUT}$ of the reference voltage generating circuit 1, and treats as inverting (−) the comparison voltage $V_{COMP}$ which is the divided voltage of the comparison voltage generating circuit 2. Then, the comparator 31 compares the comparison voltage $V_{COMP}$ to the reference voltage $V_{REF}$, and supplies a low-level operation signal POR to a downstream logic circuit (not shown) while the comparison voltage $V_{COMP}$ is more than the reference voltage $V_{REF}$. Also, the comparator 31 supplies a high-level stop signal to a downstream logic circuit while the comparison voltage $V_{COMP}$ is the reference voltage $V_{REF}$ or less.

[Circuit operation of power on reset circuit]

Figure 5A:
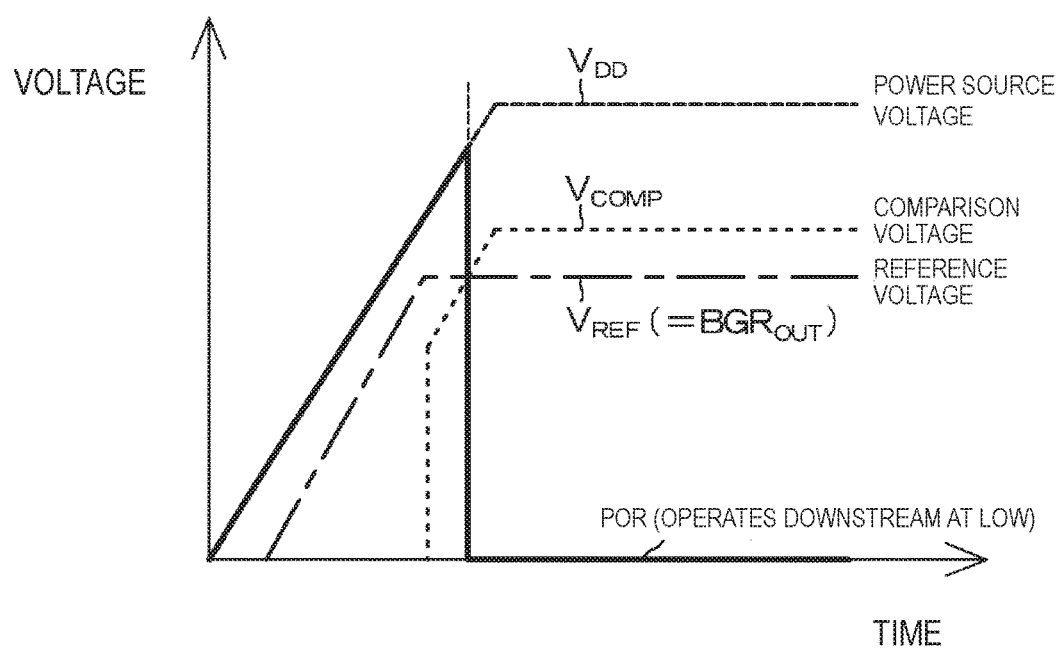
FIGS. 5A and 5B are diagrams illustrating a circuit operation of a power on reset circuit according to an embodiment of the present disclosure.
Figure 5B:
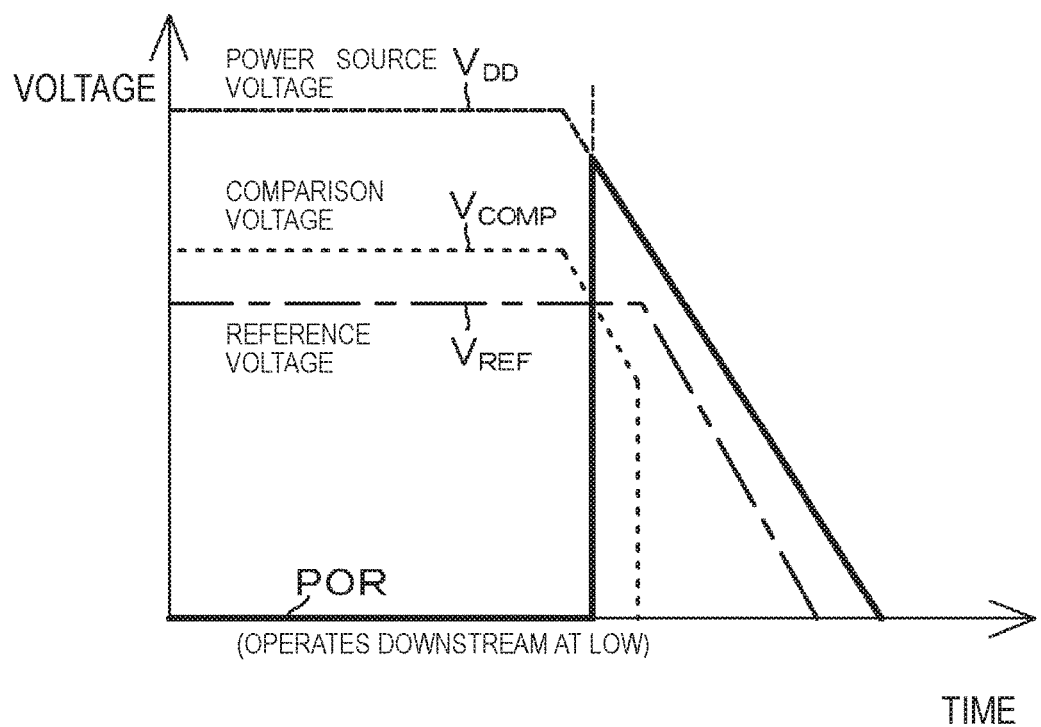

Next, the circuit operation of the power on reset circuit 10 having the above-described configuration during the rise and fall of the power source voltage $V_{DD}$ will be described with reference to FIGS. 5A, and 5B. FIG. 5A indicates voltage changes during the rise of the power source voltage $V_{DD}$, and FIG. 5B indicates voltage changes during the fall of the power source voltage $V_{DD}$.

(During Rise of Power Source Voltage)

The reference voltage generating circuit 1 constituted by the band gap reference circuit supplies its output voltage $BGR_{OUT}$ as the reference voltage $V_{REF}$ ($BGR_{OUT}=V_{REF}$) to the comparison circuit 3. In the reference voltage generating circuit 1, there exists a node at which the voltage rise during the rise of the power source voltage $V_{DD}$ is slower than the output voltage $BGR_{OUT}$, that is, the reference voltage $V_{REF}$. Specifically, the output node $N_{OP}$ of the operational amplifier OP is a node at which the voltage rise is slower than the reference voltage $V_{REF}$. The reason why the rise of the voltage at the output node $N_{OP}$ is slower than that of the reference voltage $V_{REF}$ is as previously described.

The voltage at the output node $N_{OP}$ of the operational amplifier OP, that is, the output voltage $V_{GP}$, is used as a control voltage for causing the comparison voltage generating circuit 2 to operate while the reference voltage $V_{REF}$ is in a stable state. The comparison voltage generating circuit 2 operates in response to the output voltage $V_{GP}$ of the operational amplifier OP. Specifically, the field effect transistor $M_8$ becomes in a conducting state in response to the application of the output voltage $V_{GP}$ to the gate electrode of the field effect transistor $M_8$ through the inverter circuit 21. Then, the comparison voltage generating circuit 2 generates the comparison voltage $V_{COMP}$ due to the resistance division by the resistive element $R_a$ and the resistive element $R_b$.

Accordingly, as apparent from the voltage changes indicated in FIG. 5A, the stabilization of the reference voltage $V_{REF}$ is followed by the increase of the comparison voltage $V_{COMP}$ during the rise of the power source voltage $V_{DD}$. Then, in the comparison circuit 3, the comparison voltage $V_{COMP}$ and the reference voltage $V_{REF}$ are compared with each other. While the comparison voltage $V_{COMP}$ is more than the reference voltage $V_{REF}$, the low-level operation signal POR is output from the comparator 31. While the comparison voltage $V_{COMP}$ is the reference voltage $V_{REF}$ or less, a high-level stop signal is output from the comparator 31.

(During Fall of Power Source Voltage)

The band gap reference circuit, which constitutes the reference voltage generating circuit 1, is a circuit that operates to maintain the output voltage $BGR_{OUT}$ while the operational amplifier OP has a gain. Therefore, during the fall of the power source voltage $V_{DD}$, as indicated in FIG. 5B, the reference voltage $V_{REF}$ falls later than the fall of the power source voltage $V_{DD}$. On the other hand, the comparison voltage $V_{COMP}$ starts falling substantially simultaneously with the power source voltage $V_{DD}$, and declines (decreases) in proportional to the power source voltage $V_{DD}$.

That is, the comparison voltage $V_{COMP}$ declines before the reference voltage $V_{REF}$ becomes unstable. Then, in the comparison circuit 3, the comparison voltage $V_{COMP}$ and the reference voltage $V_{REF}$ are compared with each other. When the comparison voltage $V_{COMP}$ becomes the reference voltage $V_{REF}$ or less, the comparator 31 stops the output of the operation signal POR. In other words, the comparator 31 outputs a high-level stop signal.

[Action and Effect of the Embodiments]

As described above, in the power on reset circuit 10 according to the present embodiments, the stabilization of the reference voltage $V_{REF}$ is followed by the increase of the comparison voltage $V_{COMP}$ during the rise of the power source voltage $V_{DD}$. Therefore, a stable operation is enabled even when the circuit operates under a low power source voltage. Also, during the fall of the power source voltage $V_{DD}$, the comparison voltage $V_{COMP}$ declines before the reference voltage $V_{REF}$ becomes unstable. Therefore, a stable operation is enabled even when the circuit operates under a low power source voltage.

Furthermore, in the power on reset circuit 10 according to the present embodiments, the voltage $V_{GP}$ at a specific node of the reference voltage generating circuit 1, for example, at the output node $N_{OP}$ of the operational amplifier OP, is used as a control voltage for controlling the operation of the comparison voltage generating circuit 2. Accordingly, a time difference can be provided between the reference voltage $V_{REF}$ and the comparison voltage $V_{COMP}$ without adding a redundant circuit such as a delay circuit. Furthermore, the elimination of the added redundant circuit enables the size and area of the circuit to be reduced.

[Selection of Bias Voltage]

Here, an example of the selection of a bias voltage in the power on reset circuit 10 according to the present embodiments, that is, the selection of the reference voltage $V_{REF}$, the comparison voltage $V_{COMP}$, and the like with respect to the power source voltage $V_{DD}$, will be described with reference to FIG. 6.

The power source voltage $V_{DD}$ is a low voltage of approximately 1.0 [V] to 1.2 [V], for example, 1.1 [V]. That is, the power on reset circuit 10 according to the present embodiments comes to be a power source monitoring circuit at a single low power source voltage in which the power source voltage $V_{DD}$ is approximately 1.0 [V] to 1.2 [V].

The reference voltage $V_{REF}$ generated by the band gap reference circuit is set at a value of approximately 60 to 70 [%] with respect to 1.1 [V]. A voltage (hereinafter, described as a "POR operation voltage") $V_{POR}$ at which the power on reset circuit 10 can operate comes to be an operation assurance voltage in a downstream logic circuit (not shown). This POR operation voltage $V_{POR}$ is set at a value of approximately 80 to 90 [%] with respect to 1.1 [V].

The selection of the comparison voltage $V_{COMP}$ is as follows.

When the comparison voltage $V_{COMP}$ is high, the time of intersecting the reference voltage $V_{REF}$ becomes earlier, possibly causing an operation failure at a low power source voltage.

When the comparison voltage $V_{COMP}$ is low, process variations may cause the voltage to become lower than the reference voltage $V_{REF}$.

In consideration of the above-described two matters, the value of the comparison voltage $V_{COMP}$ is selected such that an operation failure is not caused while confirming variations by simulation. Specifically, the comparison voltage $V_{COMP}$ is preferably set at a value of approximately 70 to 75 [%] with respect to 1.1 [V].

<High Frequency Communication Device>

The power on reset circuit 10 according to the above-described embodiments is suitably applied to various electronic apparatuses (electronic devices) which operate at a power source voltage $V_{DD}$ of approximately 1.0 [V] to 1.2

[V]. An example of the various electronic apparatuses may include a high frequency communication device. Hereinafter, the high frequency communication device, as an example, to which the technology according to the present disclosure is applied, will be described.

Figure 7A:
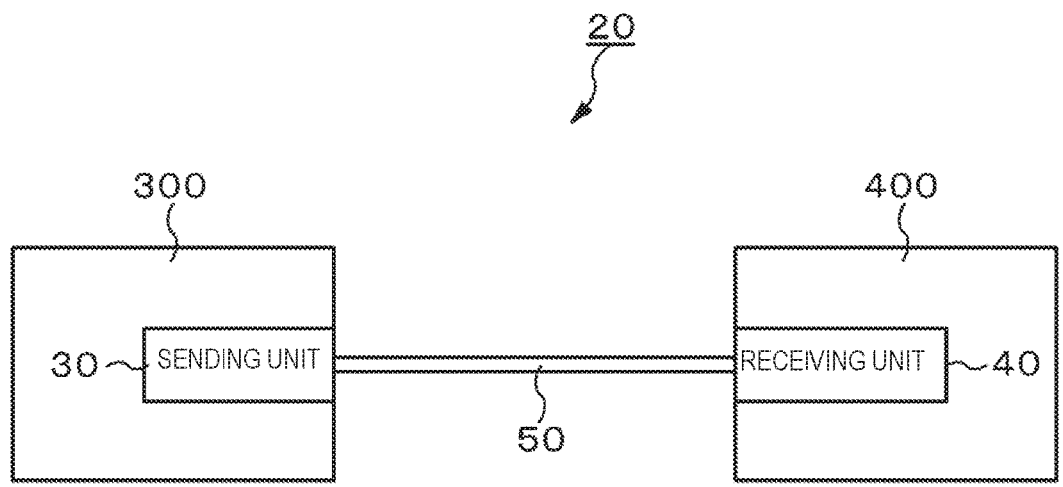
FIGS. 7A and 7B are schematic configuration diagrams indicating an example of the high frequency communication device including a power on reset circuit according to an embodiment of the present disclosure.
Figure 7B:
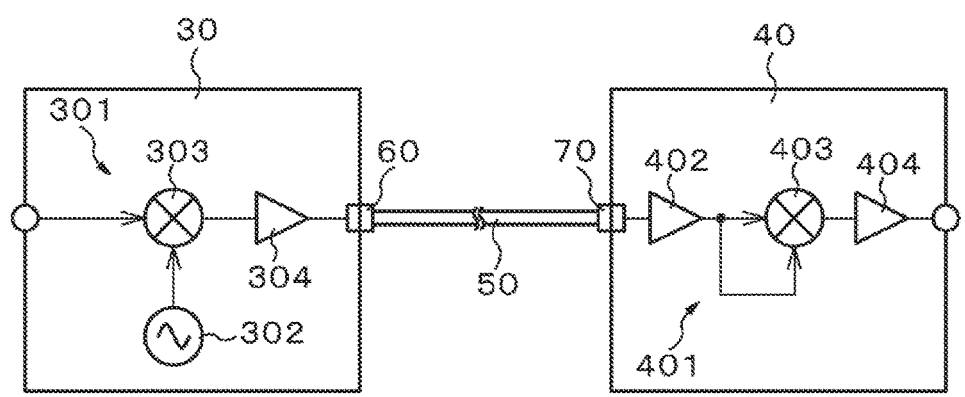

FIGS. 7A and 7B are schematic configuration diagrams indicating an example of the high frequency communication device to which the technology according to the present disclosure is applied, that is, an example of the high frequency communication device including the power on reset circuit 10 according to the above-described embodiments. FIG. 7A indicates an example of the system configuration of the high frequency communication device; and FIG. 7B indicates an example of a specific configuration of a sending unit and a receiving unit.

As indicated in FIG. 7A, a high frequency communication device 20 according to the present application example includes a sending unit 30 that sends a high frequency signal, a receiving unit 40 that receives a high frequency signal, and a dielectric waveguide (dielectric waveguide cable) 50 that transmits a high frequency signal between the sending unit 30 and the receiving unit 40.

Here, a transmission system that transmits, for example, a millimeter wave band signal as a high frequency signal through a dielectric waveguide will be described as an example.

Incidentally, the use of a millimeter wave band signal (millimeter wave communications) as a high frequency signal has the following advantages.
a) Since millimeter wave communications can have a broad communication band, a broad range of data rates can be easily obtained.
b) Since the frequency used for transmission can be maintained away from the frequency for another base band signal processing, the frequency interference between a millimeter wave and a base band signal is unlikely to be caused.
c) Since a millimeter wave band has a short wavelength, a waveguide structure which is determined depending on a wavelength can be reduced in size. In addition, since the distance decay is large, and the diffraction is minimal, electromagnetic shielding is easily performed.
d) In usually used wireless communications, the stability of a carrier wave is strictly regulated for preventing interference or the like. In order to achieve such a carrier wave having high stability, there are used an external frequency reference component having high stability, a multiplying circuit or a phase-locked loop (PLL), and the like. This causes the circuit to increase in size. On the contrary, in millimeter wave communications, external leakage can be easily prevented, and a carrier wave having low stability can be used for transmission. This can suppress the increase in size of the circuit.

In the high frequency communication device 20 according to the present application example which transmits a millimeter wave signal, the sending unit 30 performs the processing of converting a transmission target signal into a millimeter wave signal and outputting the converted signal to the dielectric waveguide 50. The receiving unit 40 performs the processing of receiving the millimeter wave signal transmitted through the dielectric waveguide 50 and converting (restoring) the received signal back into the original transmission target signal.

In the present example, the sending unit 30 is disposed inside a first communication device 300, and the receiving unit 40 is disposed inside a second communication device 400. In this case, the dielectric waveguide 50 transmits a high frequency signal between the first communication device 300 and the second communication device 400. In the communication devices 300 and 400 which respectively send and receive a signal through the dielectric waveguide 50, the sending unit 30 and the receiving unit 40 are disposed in such a manner as to become a pair in combination. The transmission system of a signal between the first communication device 300 and the second communication device 400 may be a one-direction (unidirectional) transmission system or a bidirectional transmission system.

Next, a specific configuration example of the sending unit 30 and the receiving unit 40 will be described with reference to FIG. 7B.

The sending unit 30 includes, for example, a signal generation unit 301 that processes a transmission target signal to generate a millimeter wave signal. The signal generation unit 301 is a signal conversion unit which converts a transmission target signal into a millimeter wave signal, and is constituted by, for example, an amplitude shift keying (ASK) modulation circuit. Specifically, the signal generation unit 301 is configured such that a multiplier 303 multiplies a millimeter wave signal provided from an oscillator 302 by a transmission target signal thereby to generate a millimeter wave ASK modulated wave, and the generated wave is output through a buffer 304. A connector device 60 is sandwiched between the sending unit 30 and the dielectric waveguide 50. The connector device 60 connects the sending unit 30 and the dielectric waveguide 50 by capacitive coupling, electromagnetic induction coupling, magnetic field coupling, resonator coupling, and the like.

On the other hand, the receiving unit 40 includes, for example, a signal restoring unit 401 that processes the millimeter wave signal provided through the dielectric waveguide 50 to restore the millimeter wave signal to the original transmission target signal. The signal restoring unit 401 is a signal conversion unit which converts the received millimeter wave signal into the original transmission target signal, and is constituted by, for example, a square detector circuit. Specifically, the signal restoring unit 401 is configured such that a multiplier 403 squares the millimeter wave signal (ASK modulated wave) provided through a buffer 402 thereby to convert the millimeter wave signal into the original transmission target signal, and the converted signal is output through a buffer 404. A connector device 70 is sandwiched between the dielectric waveguide 50 and the receiving unit 40. The connector device 70 connects the dielectric waveguide 50 and the receiving unit 40 by capacitive coupling, electromagnetic induction coupling, magnetic field coupling, resonator coupling, and the like.

The dielectric waveguide (dielectric waveguide cable) 50 is constituted by a waveguide structure in which a millimeter wave is transmitted in a state of being enclosed in dielectrics, and has the properties of efficiently transmitting an electromagnetic wave in the millimeter wave band. For example, this dielectric waveguide 50 may contain a dielectrics material having a dielectric constant within a certain range and a dielectric tangent within a certain range.

FIG. 8 indicates an example of a configuration of the dielectric waveguide 50 and the connector devices 60 and 70 which are used in the high frequency communication device 20 according to the present application example. In this example, the sending unit 30 configured as described above is mounted as an IC inside the connector device 60, and the receiving unit 40 configured as described above is mounted as an IC inside the connector device 70. A wiring 80A such as a signal line and a power source line is connected to the sending unit 30. A coupler 90A is sandwiched between the sending unit 30 and one end of the dielectric waveguide 50. A wiring 80B such as a signal line and a power source line is connected to the receiving unit 40. A coupler 90B is sandwiched between the receiving unit 40 and the other end of the dielectric waveguide 50.

As described above, the high frequency communication device 20 according to the present application example is a transmission system which transmits a millimeter wave signal between the sending unit 30 and the receiving unit 40 through the dielectric waveguide 50, in which the sending unit 30 and the receiving unit 40 are respectively mounted as ICs inside the connector device 60 and the connector device 70. The sending unit 30 mounted inside the connector device 60 and the receiving unit 40 mounted inside the connector device 70 are signal conversion ICs. In the transmission system which transmits a millimeter wave signal, a single power source at a low power source voltage of approximately 1.0 [V] to 1.2 [V], for example, 1.1 [V], is used, and power is supplied from this single power source to the connector device 60 and the connector device 70.

In the high frequency communication device 20 according to the present application example in which such a low voltage power source is used as an operation power source, there is used the power on reset circuit 10 according to the above-described embodiments. Specifically, the sending unit 30 mounted inside the connector device 60 and the receiving unit 40 mounted inside the connector device 70 each come to include the power on reset circuit 10. This ensures stable operations of the sending unit 30 and the receiving unit 40 during the rise of the power source and during the fall of the power source even under a low power source voltage.

Also, the sending unit 30 mounted inside the connector device 60 and the receiving unit 40 mounted inside the connector device 70, which are signal conversion ICs, are minute chips. Here, the power on reset circuit 10 according to the above-described embodiments eliminates a redundant added circuit, thereby enabling the size and area of the circuit to be reduced. Thus, the power on reset circuit 10 can be formed as signal conversion ICs (30 and 40) constituted by minute chips to be mounted inside the connector device 60 and the connector device 70.

It is noted that although both of the sending unit 30 and the receiving unit 40 include the power on reset circuit 10 here, either one of them may include the power on reset circuit 10.

Additionally, the present technology may also be configured as below.

(1)

A power on reset circuit, including:

a reference voltage generating circuit that generates a reference voltage, and also outputs, as a control voltage, a voltage at a node at which a voltage rise is slower than the reference voltage;

a comparison voltage generating circuit that operates in response to the control voltage output from the reference voltage generating circuit, and outputs a comparison voltage depending on a power source voltage; and a comparison circuit that compares the comparison voltage output from the comparison voltage generating circuit to the reference voltage output from the reference voltage generating circuit, and outputs an operation signal while the comparison voltage exceeds the reference voltage.

(2)

The power on reset circuit according to (1), wherein the reference voltage generating circuit is constituted by a band gap reference circuit.

(3)

The power on reset circuit according to (2), wherein the band gap reference circuit includes:

a first diode element including one diode element;

a second diode element including a plurality of diode elements which are connected in parallel;

current sources that supply the first diode element and the second diode element with currents having identical current values; and an operational amplifier that controls the current sources such that the first diode element and the second diode element have identical inter-terminal voltages, and a node at which the voltage rise is slower than the reference voltage is the output node of the operational amplifier.

(4)

The power on reset circuit according to any one of (1) to (3), wherein the comparison voltage generating circuit is constituted by a resistive divider circuit, the resistive divider circuit including:

two resistive elements that are connected in series between a power source line of a power source voltage and a ground; and a switch element that selectively connects the power source line and the two resistive elements depending on the control voltage output from the reference voltage generating circuit.

(5)

A high frequency communication device including a power on reset circuit, the power on reset circuit including:

a reference voltage generating circuit that generates a reference voltage, and also outputs, as a control voltage, a voltage at a node at which a voltage rise is slower than the reference voltage;

a comparison voltage generating circuit that operates in response to the control voltage output from the reference voltage generating circuit, and outputs a comparison voltage depending on a power source voltage; and a comparison circuit that compares the comparison voltage output from the comparison voltage generating circuit to the reference voltage output from the reference voltage generating circuit, and outputs an operation signal while the comparison voltage exceeds the reference voltage.

(6)

The high frequency communication device according to (5), including:

a sending unit that converts a transmission target signal into a high frequency signal, and sends the converted signal;

a waveguide cable that transmits the high frequency signal sent from the sending unit; and a receiving unit that restores the high frequency signal received through the waveguide cable into the original transmission target signal, wherein the sending unit is mounted inside a connector device that couples the sending unit and the waveguide cable, the receiving unit is mounted inside a connector device that couples the waveguide cable and the receiving unit, and at least one of the sending unit and the receiving unit has the power on reset circuit.

(7)
The high frequency communication device according to (5) or (6),
wherein a high frequency signal is a millimeter wave band signal.

REFERENCE SIGNS LIST 1 reference voltage generating circuit (band gap reference circuit)
2 comparison voltage generating circuit (resistive divider circuit)
3 comparison circuit
10 power on reset circuit
11 start-up circuit
20 high frequency communication device
30 sending unit
40 receiving unit
50 dielectric waveguide (dielectric waveguide cable)

The invention claimed is:

1. A power on reset circuit, comprising:
a reference voltage generating circuit that includes an operational amplifier, wherein the reference voltage generating circuit is configured to:
generate a reference voltage; and
output, as a control voltage, a first voltage at an output node of the operational amplifier, wherein a voltage rise of the first voltage at the output node is slower than a voltage rise of the reference voltage;
a comparison voltage generating circuit that includes a resistive divider circuit; and
a comparison circuit, wherein
the resistive divider circuit includes:
an inverter circuit configured to invert a polarity of the control voltage; and
at least two resistive elements connected in series,
the resistive divider circuit is configured to:
obtain a divided voltage at a first common connection node based on a power source voltage and the control voltage that has the inverted polarity, wherein the first common connection node is between the at least two resistive elements;
output the divided voltage as a comparison voltage; and
supply an enable signal to the comparison circuit based on the control voltage, and
the comparison circuit is configured to:
compare the comparison voltage with the reference voltage based on the enable signal; and
output an operation signal based on the comparison voltage that exceeds the reference voltage.

2. The power on reset circuit according to claim 1, wherein the reference voltage generating circuit further includes a band gap reference circuit.

3. The power on reset circuit according to claim 2, wherein
the band gap reference circuit includes:
a first diode element including one diode element;
a second diode element including a plurality of diode elements connected in parallel;
a first current source configured to supply a current of a first value to the first diode element; and
a second current source configured to supply the current of a second value to the second diode element,
the first value is equal to the second value, and
the operational amplifier is configured to control each of the first current source and the second current source such that the first diode element and the second diode element have identical inter-terminal voltages.

4. The power on reset circuit according to claim 1, wherein
the at least two resistive elements are connected in series between a power source line of the power source voltage and a ground, and
the resistive divider circuit further includes a switch element configured to selectively connect the power source line and the at least two resistive elements based on the control voltage.

5. The power on reset circuit according to claim 1, wherein
the operational amplifier comprises an inverting input and a non-inverting input,
a second voltage at a second common connection node is input to the inverting input of the operational amplifier, and
a third voltage at a third common connection node is input to the non-inverting input of the operational amplifier.

6. The power on reset circuit according to claim 5, wherein
the second common connection node is between a first current source of the reference voltage generating circuit and a first diode element of the reference voltage generating circuit, and
the third common connection node is between a second current source of the reference voltage generating circuit and a second diode element of the reference voltage generating circuit.

7. A high frequency communication device, comprising:
a power on reset circuit that includes:
a reference voltage generating circuit that includes an operational amplifier, wherein the reference voltage generating circuit is configured to:
generate a reference voltage; and
output, as a control voltage, a first voltage at an output node of the operational amplifier, wherein a voltage rise of the first voltage at the output node is slower than a voltage rise of the reference voltage;
a comparison voltage generating circuit that includes a resistive divider circuit; and
a comparison circuit, wherein
the resistive divider circuit includes:
an inverter circuit configured to invert a polarity of the control voltage; and
at least two resistive elements connected in series,
the resistive divider circuit is configured to:
obtain a divided voltage at a common connection node based on a power source voltage and the control voltage that has the inverted polarity, wherein the common connection node is between the at least two resistive elements;
output the divided voltage as a comparison voltage; and
supply an enable signal to the comparison circuit based on the control voltage, and
the comparison circuit is configured to:
compare the comparison voltage with the reference voltage based on the enable signal; and
output an operation signal based on the comparison voltage that exceeds the reference voltage.

8. The high frequency communication device according to claim 7, further comprising:
a first connector device;
a second connector device;

a waveguide cable;
a receiving unit mountable inside the first connector device, wherein the first connector device is configured to couple the waveguide cable and the receiving unit; and
a sending unit configured to:
convert a transmission target signal into a high frequency signal; and
send the high frequency signal to the waveguide cable, wherein
the waveguide cable is configured to transmit the high frequency signal to the receiving unit,
the receiving unit is configured to restore the high frequency signal into the transmission target signal,
the sending unit is mountable inside the second connector device, wherein the second connector device is configured to couple the sending unit and the waveguide cable, and
at least one of the sending unit or the receiving unit includes the power on reset circuit.

9. The high frequency communication device according to claim 8, wherein the high frequency signal is a millimeter wave band signal.

\* \* \* \* \*